(12) United States Patent
Chew et al.

(10) Patent No.: US 8,709,874 B2
(45) Date of Patent: Apr. 29, 2014

(54) MANUFACTURING METHOD FOR SEMICONDUCTOR DEVICE CARRIER AND SEMICONDUCTOR PACKAGE USING THE SAME

(75) Inventors: Hwee-Seng Jimmy Chew, Singapore (SG); Kian-Hock Lim, Singapore (SG); Oviso Dominador Jr Fortaleza, Singapore (SG); Shoa-Siong Raymond Lim, Singapore (SG)

(73) Assignee: Advanpack Solutions Pte Ltd., Singapore (SG)

( * ) Notice: Subject to any disclaimer, the term of this patent is extended or adjusted under 35 U.S.C. 154(b) by 343 days.

(21) Appl. No.: 13/222,792

(22) Filed: Aug. 31, 2011

(65) Prior Publication Data

US 2012/0058604 A1 Mar. 8, 2012

Related U.S. Application Data (60) Provisional application No. 61/378,447, filed on Aug. 31, 2010.

(51) Int. Cl.
*H01L 21/56* (2006.01)
(52) U.S. Cl.
USPC .............. 438/118; 438/113; 438/127

(58) Field of Classification Search
USPC .......... 438/106, 110–114, 118–119, 127, 108
See application file for complete search history.

(56) References Cited

U.S. PATENT DOCUMENTS

| | | | |
|---|---|---|---|
| 7,790,505 B2 * | 9/2010 | Lin et al. | 438/113 |
| 7,915,080 B2 * | 3/2011 | Takahashi et al. | 438/108 |
| 8,159,828 B2 * | 4/2012 | Sun et al. | 361/761 |
| 8,338,232 B2 * | 12/2012 | Shi et al. | 438/108 |
| 2006/0094158 A1 * | 5/2006 | Lee et al. | 438/106 |

* cited by examiner

*Primary Examiner* — Savitr Mulpuri
(74) *Attorney, Agent, or Firm* — Rabin & Berdo, P.C.

(57) ABSTRACT

A conductive carrier having a first surface and a second surface is provided. The conductive trace layer is formed on the second surface of the conductive carrier. A conductive stud layer is formed on the conductive trace layer. A dielectric layer is formed on the conductive layer to encapsulate the conductive trace layer and the conductive stud layer. The conductive stud layer is exposed. A plating conductive layer is formed to envelop the conductive carrier, the dielectric layer and the exposed end of the conductive stud layer. A cavity is formed on the conductive carrier, wherein the conductive trace layer and the dielectric layer are exposed in the cavity. A surface finishing is formed on at least an exposed portion of the conductive stud layer. The plating conductive layer is removed.

28 Claims, 7 Drawing Sheets

MANUFACTURING METHOD FOR SEMICONDUCTOR DEVICE CARRIER AND SEMICONDUCTOR PACKAGE USING THE SAME

This application claims the benefit of U.S. provisional application Ser. No. 61/378,447, filed Aug. 31, 2010, the subject matter of which is incorporated herein by reference.

BACKGROUND OF THE INVENTION

1. Field of the Invention

The invention relates in general to a manufacturing method for a semiconductor device carrier and a manufacturing method for a semiconductor package using the same, and more particularly to a manufacturing method for a semiconductor device carrier having a cavity and a manufacturing method for a semiconductor package using the same.

2. Description of the Related Art

A conventional semiconductor package typically includes substrate, semiconductor device and interconnection. The substrate, such as plastic or ceramic substrate, is used for carrying a chip. The substrate, having a first surface and a second surface opposite to the first surface, includes at least a pad and a through-hole. The chip is disposed on the first surface of the substrate. The interconnection connects the semiconductor device to the pad located on the first surface of the substrate. The pad of the substrate is electrically connected to the second surface of the substrate via a through-hole.

Since the through-hole penetrates the substrate, the structural strength of the substrate will be weakened. Hence, the through-hole is separated from one another as well as the edges of the substrate by a large distance so that the structural strength of the substrate is still within an acceptable range. However, such practice will make it difficult to reduce the size of the semiconductor package. Besides, the thickness of the substrate is relatively large and hence makes it difficult to reduce the thickness of the semiconductor package.

SUMMARY OF THE INVENTION

The invention is related to a manufacturing method for a semiconductor device carrier and a manufacturing method for a semiconductor package using the same. The dielectric layer of the semiconductor device carrier encapsulates a conductive trace layer and a conductive stud layer, which electrically connects the two opposite sides of the semiconductor device carrier. Since no through-hole is required and the dielectric layer has a smaller thickness, the size of the semiconductor package is effectively reduced.

According to a first aspect of the present invention, a manufacturing method for a semiconductor device carrier is provided. The manufacturing method for a semiconductor device carrier comprises of the following steps. A conductive carrier having a first surface and a second surface is provided. The conductive trace layer is formed on the second surface of the conductive carrier. A conductive stud layer is formed on the conductive trace layer. A first dielectric layer is formed on the conductive carrier to encapsulate the conductive trace layer and the conductive stud layer. The conductive stud layer is exposed. A plating conductive layer is formed to envelop the conductive carrier, the first dielectric layer and the exposed base surface of the conductive stud layer. A cavity is formed on the conductive carrier to expose the conductive trace layer and the first dielectric layer. A first surface finishing is formed on at least an exposed portion of the conductive trace layer in the cavity. The plating conductive layer is removed.

According to a second aspect of the present invention, a manufacturing method for a semiconductor device carrier is provided. The manufacturing method for a semiconductor device carrier comprises of the following steps. A dielectric layer having a first dielectric surface and a second dielectric surface is provided. The dielectric layer encapsulates a plurality of conductive trace layers, wherein the conductive trace layers extend from the first dielectric surface to the second dielectric surface and comprise a plurality of traces which are mutually isolated from one another. A plating conductive layer is formed on the second dielectric surface and the traces exposed on the second dielectric surface, wherein the plating conductive layer electrically interconnects every trace. A surface finishing is formed on at least a portion of each trace exposed on the first dielectric surface by electrolytic plating. The plating conductive layer is removed to re-expose the second dielectric surface.

According to a third aspect of the present invention, a manufacturing method for a semiconductor package is provided. The manufacturing method for a semiconductor package comprises of the following steps. A conductive carrier having a first surface and a second surface opposite to the first surface is provided. A conductive trace layer is formed on the second surface of the conductive carrier. A conductive stud layer is formed on the conductive trace layer. A first dielectric layer is formed on the conductive carrier to encapsulate the conductive trace layer and the conductive stud layer. The conductive stud layer is exposed. A plating conductive layer is formed to envelop the conductive carrier, the first dielectric layer and the exposed conductive stud layer. A cavity is formed on the conductive carrier to expose the conductive trace layer and the first dielectric layer in the cavity. A first surface finishing is formed on at least a portion of the conductive trace layer in the cavity. The plating conductive layer is removed. A semiconductor device is disposed adjacent to the conductive trace layer. A second dielectric layer is formed to encapsulate the semiconductor device.

The above and other aspects of the invention will become better understood with regard to the following detailed description of the preferred but non-limiting embodiment (s). The following description is made with reference to the accompanying drawings.

DETAILED DESCRIPTION OF THE INVENTION

Referring to FIGS. 1A~1J. FIGS. 1A~1J illustrates the processes of manufacturing a semiconductor device carrier according to an embodiment of the invention.

Figure 1A:
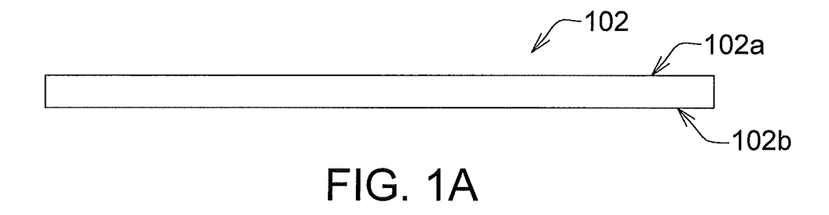
FIGS. 1A~1J shows the processes of manufacturing a semiconductor device carrier according to an embodiment of the invention.

Referring to FIG. 1A, a conductive carrier 102 having a first surface 102a and a second surface 102b opposite to the first surface 102a is provided, wherein the conductive carrier 102 is preferably formed by a metal plate comprising of copper, iron or steel.

Figure 1B:
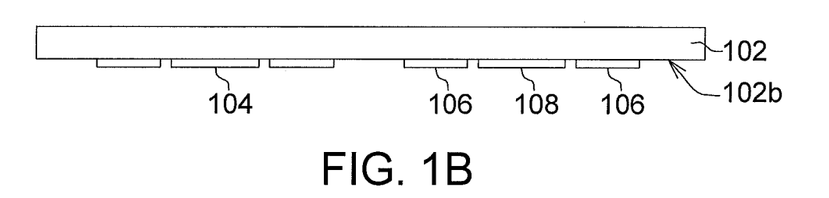

Referring to FIG. 1B, a conductive trace layer 104 is formed on the second surface 102b of the conductive carrier 102 preferably by means of photolithography and electrolytic plating. The conductive trace layer 104 is patterned to comprise of at least a trace 106 and at least a die pad 108, and preferably formed by metal layers comprising of copper.

Figure 1C:
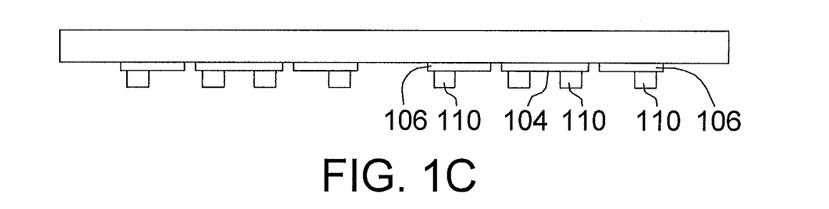

Referring to FIG. 1C, a conductive stud layer is formed on the conductive trace layer 104 preferably by means of photolithography and electrolytic plating. The conductive stud layer comprises of at least a conductive stud 110 connected to the corresponding trace 106 and die pad 108, and preferably formed by a metal such as copper.

Figure 1D:
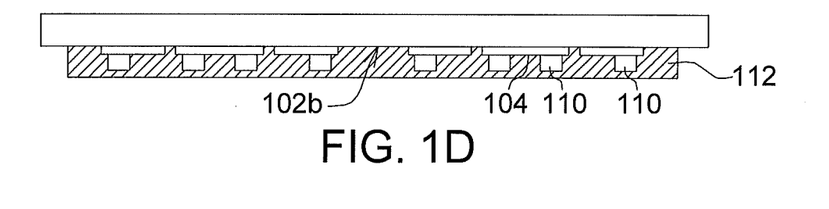

Referring to FIG. 1D, a first dielectric layer 112 is preferably formed by transfer molding to encapsulate the conductive trace layer 104, the conductive stud layer and the second surface 102b. In the present embodiment of the invention, the first dielectric layer 112 completely encapsulates the conductive trace layer 104 and the conductive stud layer. The first dielectric layer 112 is preferably formed by a material comprising of novolac-based resin, epoxy-based resin, silicone-based resin or other suitable encapsulant. The material is first heated to a molten state to encapsulate the conductive trace layer 104 and the conductive stud layer under a high-temperature and high-pressure environment and thereafter solidifies to form the first dielectric layer 112. Preferably, the first dielectric layer 112 also comprises of a suitable filler material such as powdered silicon dioxide.

Exemplary steps for forming a first dielectric layer 112 are as follows. Firstly, an encapsulant comprising of resin and powdered silicon dioxide is provided and heated to a molten state. Next, the molten encapsulant is infused onto the second surface 102b of the conductive carrier 102 and simultaneously envelops the conductive trace layer 104 and the conductive stud layer (including at least a conductive stud 110) under a high-temperature and high-pressure environment. Thereafter the encapsulant is solidified to form the first dielectric layer 112.

In other implementations, the first dielectric layer 112 can also be formed by injection molding or compression molding.

Preferably, prior to the step of forming the first dielectric layer 112, an adhesion layer (not illustrated) is formed on the surface of the conductive trace layer 104 and the surface of the conductive stud layer to enhance the adhesion between these surfaces and the first dielectric layer 112 and increase the reliability of the product accordingly.

Figure 1E:
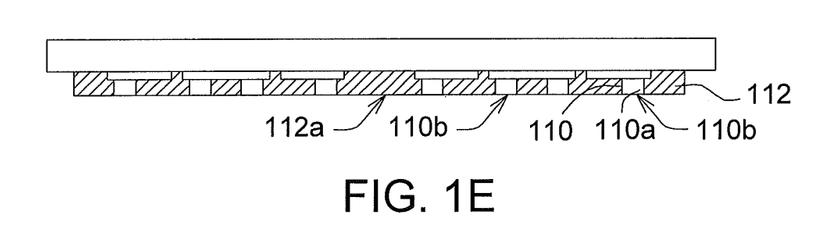

Referring to FIG. 1E, a partial layer of the first dielectric layer 112 is removed preferably by grinding to expose a base surface 110b of an end 110a of the conductive stud 110. After removal, a first dielectric surface 112a is formed on the first dielectric layer 112, and the base surface 110b is formed on the conductive stud 110. Preferably, the base surface 110b of the conductive stud 110 is substantially aligned with (such as coplanar with) the first dielectric surface 112a. In other implementations, the base surface 110b of the end 110a of the conductive stud 110 is exposed simultaneously when the first dielectric layer 112 is formed, such that subsequent removal of any partial layer of the first dielectric layer 112 is not required.

Figure 1F:
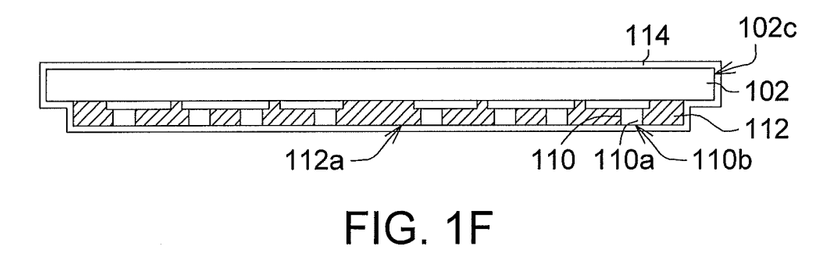

Referring to FIG. 1F, a plating conductive layer 114 is formed to completely envelop the conductive carrier 102, the first dielectric layer 112 and the exposed end 110a of the conductive stud 110. Preferably, the plating conductive layer 114 is formed by electroless plating and enveloped the first surface 102a, the lateral side 102c and any exposed second surface 102b of the conductive carrier 102, the first dielectric surface 112a and the lateral side 112b of the first dielectric layer 112, as well as the exposed end 110a of the conductive stud 110. The thickness of the plating conductive layer 114 ranges between 6~10 μm. In addition, the plating conductive layer 114 is preferably formed by a single-layered metal comprising of copper or nickel.

Alternatively, the plating conductive layer 114 can also be formed by multi-layered metals. In another implementation, the formation of the conductive layer 114 comprises of the following steps. Firstly, a seed layer (not illustrated) is formed by electroless plating to envelop the conductive carrier 102, the first dielectric layer 112 and the exposed end 110a of the conductive stud 110. The area encapsulated by the seed layer is similar to that encapsulated by the plating conductive layer 114 as described above.

Thereafter a sub-conductive layer is formed over the seed layer by electrolytic plating. Both the seed layer and sub-conductive layer comprises of copper or nickel respectively. Preferably, the thickness of the seed layer ranges between 1~2 μm, and the thickness of the sub-conductive layer ranges between 5~8 μm.

Figure 1G:
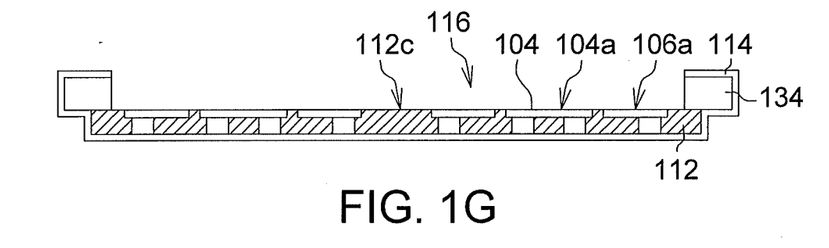

Referring to FIG. 1G, at least one cavity 116 is formed in the conductive carrier 102 wherein the conductive trace layer 104 and the first dielectric layer 112 are exposed in the cavity 116. Preferably, a portion of the conductive carrier 102 is removed by photolithography and etching to form the cavity 116. Specifically, the trace surface 104a of the conductive trace layer 104 and the second dielectric surface 112c of the first dielectric layer 112 are exposed from the cavity 116, wherein the trace surface 104a and the second dielectric surface 112c are opposite to the first dielectric surface 112a. The die pad 108 has a die pad surface 108a and the trace 106 has a trace surface 106a, wherein the die pad surface 108a and the trace surface 106a define the trace surface 104a. Preferably, when the portion of the conductive carrier 102 is removed by etching, the conductive trace layer 104 further comprises of an etching barrier layer (not illustrated) interposed between the conductive carrier 102 and the conductive trace layer 104. The etching barrier layer comprises of nickel (Ni) or gold (Au).

After a portion of the conductive carrier 102 is removed, the remaining portion of the conductive carrier 102 forms a plating ring 134 around the peripheral of the first dielectric layer 112. The plating ring 134 is electrically connected to the conductive stud 110 and the conductive trace layer 104 via the plating conductive layer 114 on the first dielectric surface 112a.

Figure 1H:
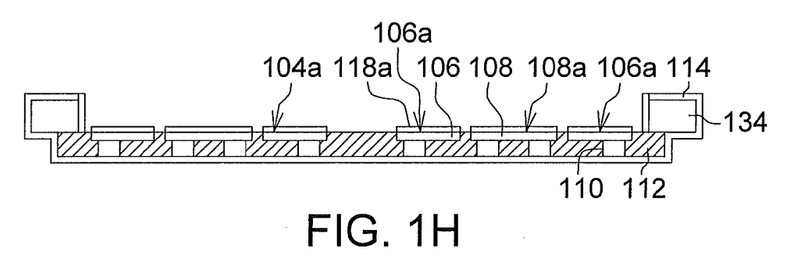

Referring to FIG. 1H, a first surface finishing 118a is formed on the exposed conductive trace layer 104. Preferably, the first surface finishing 118a is formed by electroplating on the entire trace surface 104a of the conductive trace layer 104 exposed in the cavity 116.

Alternatively, in other implementations, the first surface finishing 118a is formed on part of the trace surface 104a of the conductive trace layer 104 exposed in the cavity 116 after photolithography. Preferably, the first surface finishing 118a is only formed on the trace surface 106a of the trace 106, but not on the die pad surface 108a of the die pad 108. In addition, the first surface finishing 118a can further be formed on part of the trace surface 106a of the trace 106 only.

The first surface finishing 118a is formed by electrolytic plating and comprises of nickel (Ni), palladium (Pa) or gold (Au).

Specifically, in FIG. 1G, the plating conductive layer 114 electrically contacts the conductive stud 110, such that the conductive trace layer 104 is electrically connected to the plating ring 134 via the conductive stud 110 and the plating conductive layer 114. The plating ring 134 is subsequently connected to the electrode of the plating facility to allow electric current to flow through the plating conductive layer 114 for electroplating the first surface finishing 118a on the conductive trace layer 104. Furthermore, in FIG. 1H, every trace 106 and every die pad 108 of the conductive layer 104 are isolated from one another by the first dielectric layer 112 (two neighboring traces are also isolated from each other). However, the plating conductive layer 114 electrically connects all the trace 106 and die pad 108 together such that the first surface finishing 118a can be electroplated onto the conductive trace layer 104 simultaneously.

Figure 1I:
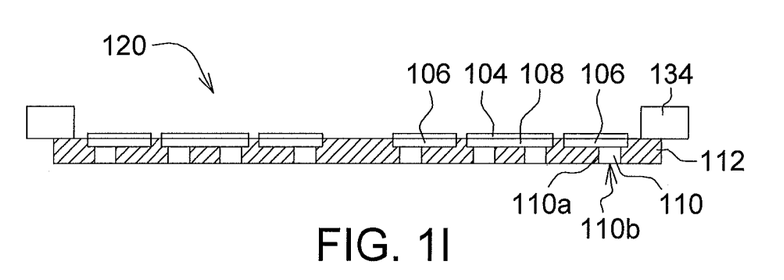

Referring to FIG. 1I, after forming the first surface finishing 118a, the plating conductive layer 114 is subsequently removed preferably by etching to re-expose the base surface 110b of the end 110a of the conductive stud 110 and the first dielectric surface 112a. After the plating conductive layer 114 is removed, every trace 106 and every die pad 108 of the conductive trace layer 104 are mutually isolated from one another and embedded in the first dielectric layer 112 respectively.

Figure 1J:
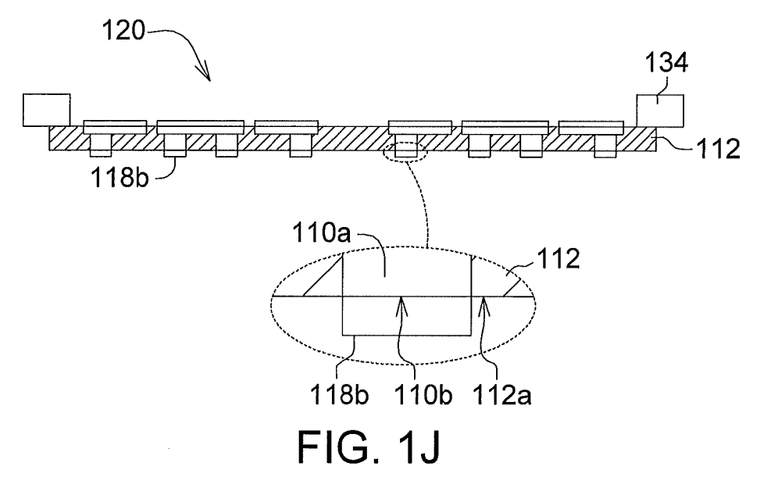

Referring to FIG. 1J, a second surface finishing 118b is thereafter formed on the exposed base surface 110b of the end 110a of the conductive stud 110 preferably by electroless plating. Thus, the formation of the semiconductor device carrier 120 of the present embodiment of the invention is completed.

Figures 3, 4A:
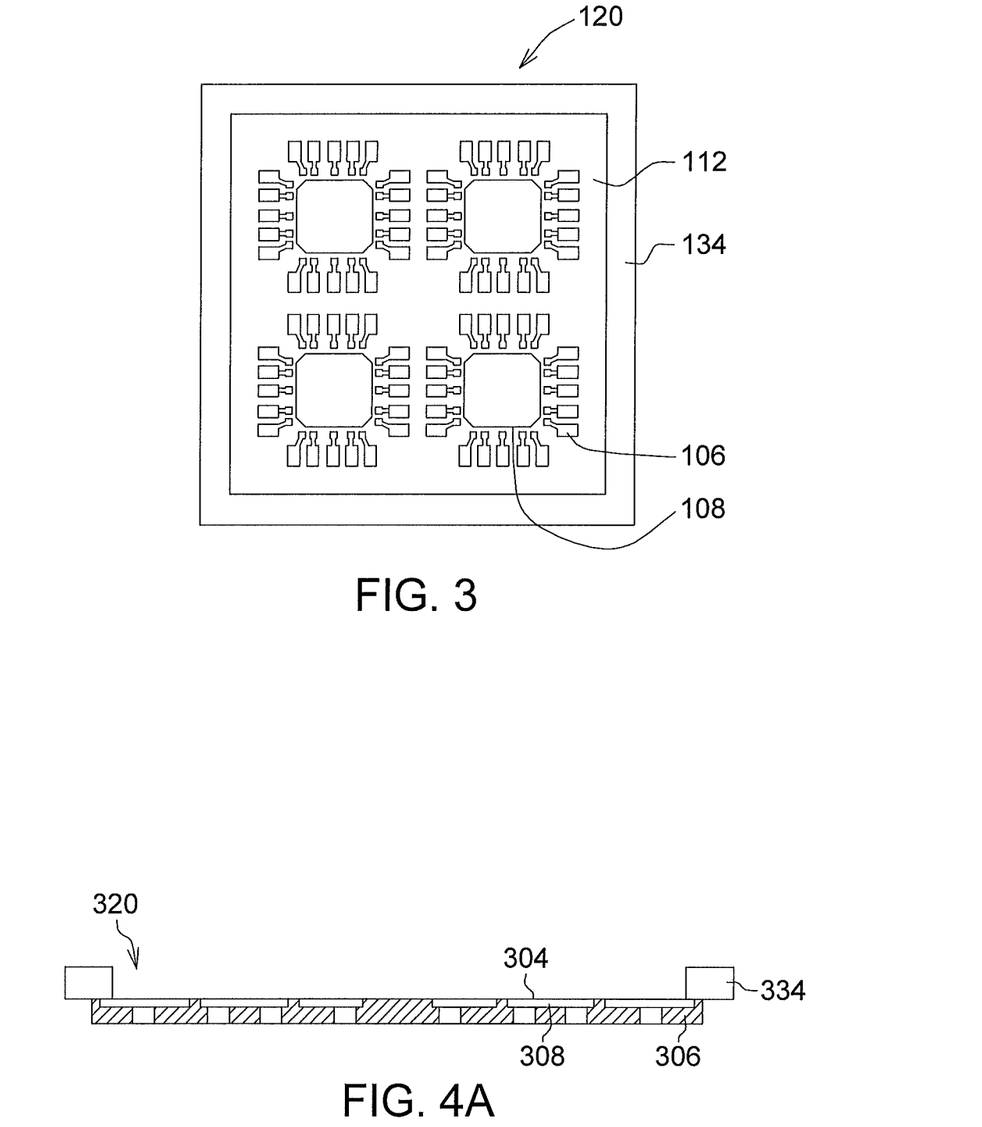
FIG. 3 shows a top view of the semiconductor device carrier of FIG. 1J.
FIG. 4A shows a cross-sectional view of a semiconductor device carrier according to another embodiment of the invention.
Figure 4B:
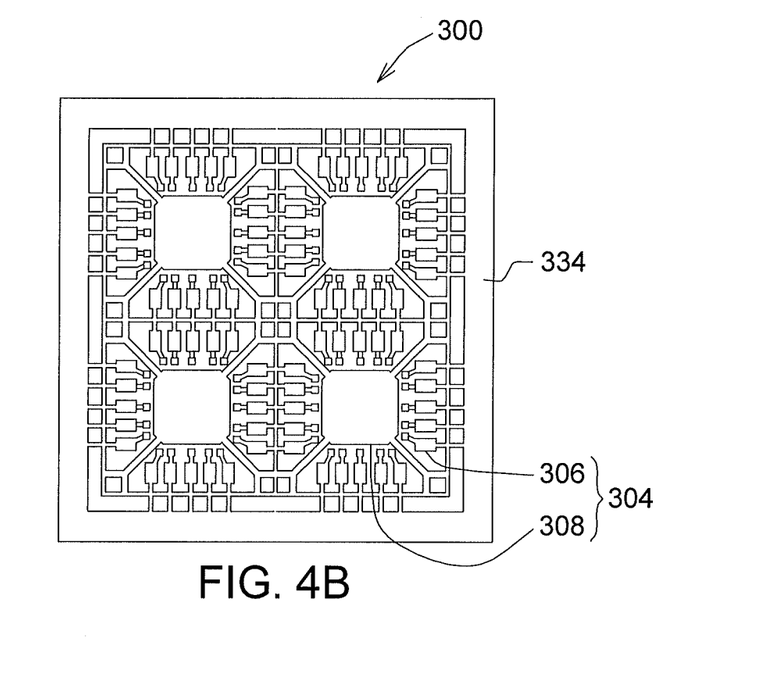
FIG. 4B shows a top view of the semiconductor device carrier of FIG. 4A.

Referring to FIG. 3, a top view of the semiconductor device carrier of FIG. 1J is shown. As shown in FIG. 3, the conductive trace layer 104 and the plating ring 134 are separated from each other by the first dielectric layer 112, but such exemplification does not limit the invention. Referring to FIGS. 4A~4B. FIG. 4A shows a cross-sectional view of a semiconductor device carrier according to another embodiment of the invention. FIG. 4B shows a top view of the semiconductor device carrier of FIG. 4A. The conductive trace layer 304 of the semiconductor device carrier 320 is electrically connected to the plating ring 334 of the semiconductor device carrier 320. Specifically, every trace 306 and every die pad 308 of the conductive trace layer 104 are interconnected and further connected electrically to the plating ring 334.

Referring to FIG. 1J, the plating conductive layer 114 is completely removed, but such exemplification does not limit the invention, and the invention is further elaborated below by other examples.

Figure 2A:
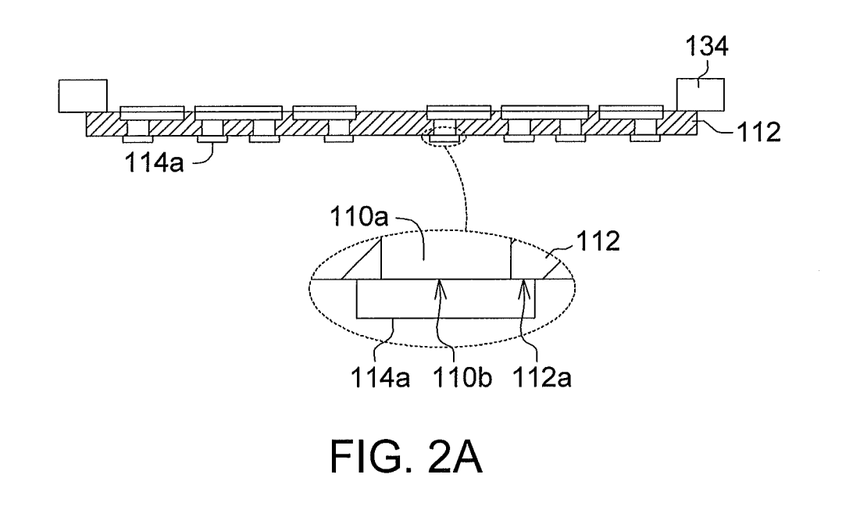
FIGS. 2A~2B shows the processes of manufacturing a semiconductor device carrier according to another embodiment of the invention.
Figure 2B:
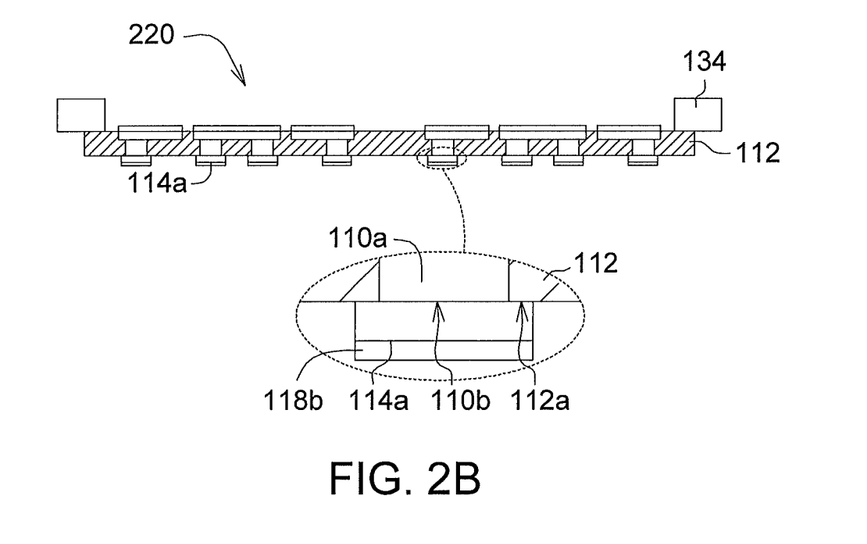

Referring to FIGS. 2A~2B, FIGS. 2A~2B illustrates the processes of manufacturing a semiconductor device carrier according to another embodiment of the invention are shown.

Referring to FIG. 2A, a portion of the plating conductive layer 114 is removed to form a remaining portion 114a, wherein the remaining portion 114a of the plating conductive layer 114 at least covers part of the conductive stud 110. In the present embodiment, the remaining portion 114a of the plating conductive layer 114 covers the entire base surface 110b of the conductive stud 110 and also extends onto a portion of the first dielectric surface 112a of the first dielectric layer 112. Consequently, the area of the remaining portion 114a of the plating conductive layer 114 is larger than that of the base surface 110b of the conductive stud 110. Using the remaining portion 114a as an enlarged electrical pad (bond pad) can help to improve the electrical and assembly quality. In another embodiment, the remaining portion 114a of the plating conductive layer 114 only covers the base surface 110b of the conductive stud 110 but not the first dielectric surface 112a.

Referring to FIG. 2B, a second surface finishing 118b is subsequently formed on the remaining portion 114a of the plating conductive layer 114 preferably by electroless plating.

Referring to FIG. 2A, alternatively the remaining portion 114a can also be considered as the second surface finishing 118b and formed simultaneously when the plating conductive layer 114 is removed. Thus the present embodiment of the invention does not require an additional manufacturing process for forming the second surface finishing 118b on the base surface 110b of the conductive stud 110. After a portion of the plating conductive layer 114 is removed, the second surface finishing 118b is also formed. Thus the formation of the semiconductor device carrier 220 is completed.

Figure 1K:
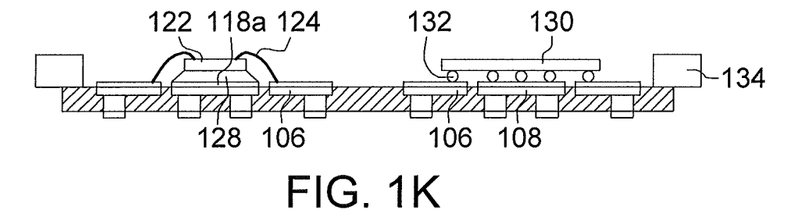
FIG. 1K~1M shows the processes of manufacturing a semiconductor package using the semiconductor device carrier.
Figure 1L:
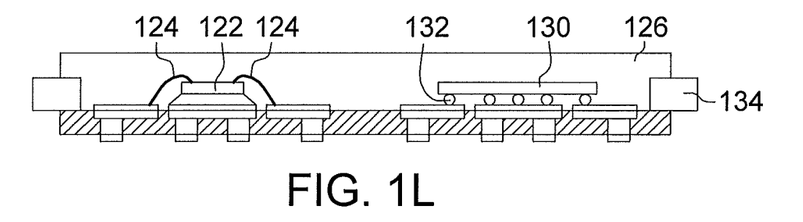
Figure 1M:
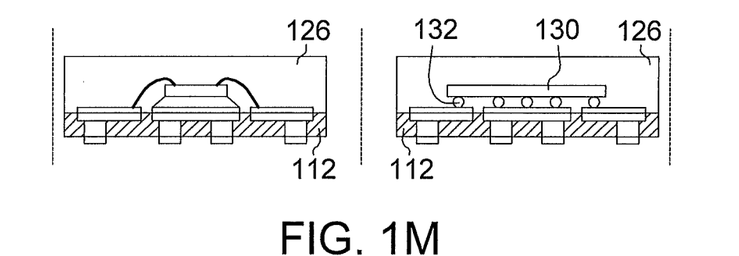

Referring to FIG. 1K to 1M, FIG. 1K to 1M illustrates the processes of manufacturing a semiconductor package using the semiconductor device carrier 220. Referring to FIG. 1K, at least one semiconductor device 122 is disposed adjacent to the conductive trace layer 104. Preferably, the semiconductor device 122 has a rear surface 122b and an active surface 122a opposite to the rear surface 122b. In one instance, the rear surface 122b of the semiconductor device 122 may be attached to the conductive trace layer 104 by means of an adhesive 128. The face-up active surface 122a of the semiconductor device 122 is electrically connected to the trace 106 via at least one bonding wire 124 by connecting to the first surface finishing 118a of the trace 106. In another instance, the active surface of the semiconductor device 130 is in a face-down manner and several interconnections 132 are electrically connecting the semiconductor device 130 to at least one of the die pad 108 or the trace 106 via the first surface finishing 118a. In this case, the semiconductor device 130 is a flip-chip. In other implementation, in the absence of the first surface finishing 118a, the interconnections 132 of the semiconductor device 130 bond directly onto at least one of the die pad 108 or the trace 106.

Referring to FIG. 1L, a second dielectric layer 126 is formed by molding to encapsulate the semiconductor device 122 and the bonding wire 124.

Referring to FIG. 1M, the second dielectric layer 126 and the first dielectric layer 112 are singulated by using a cutting tool or laser to separate the assembled semiconductor device carrier 120. Thus the formation of the semiconductor package 100 is completed.

According to the manufacturing method for a semiconductor device carrier and the manufacturing method for a semiconductor package using the same disclosed in the above embodiments of the invention, the dielectric layer of the semiconductor device carrier encapsulates the conductive trace layer and the conductive stud layer which electrically connects the two opposite sides of the semiconductor device carrier. Since no through-hole is required and the dielectric layer has a smaller thickness, the size of the semiconductor package is thus effectively reduced. Furthermore, since the surface finishing on the mutually isolated traces and die pads of the conductive trace layer is formed by electrolytic plating, the stability and reliability of the product are further increased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a semiconductor device carrier comprising:
   providing a conductive carrier having a first surface and a second surface opposite the first surface;
   forming a conductive trace layer on the second surface of the conductive carrier;
   forming a conductive stud layer on the conductive trace layer;
   forming a dielectric layer to encapsulate the conductive trace layer and the conductive stud layer, wherein the conductive stud layer is exposed from the dielectric layer;
   forming a plating conductive layer to envelop the conductive carrier, the dielectric layer and the exposed conductive stud layer;
   forming at least one cavity on the conductive carrier by removing a portion of the conductive carrier, wherein
   the cavity exposes the conductive trace layer,
   the remaining portion of the conductive carrier forms a plating ring around the peripheral of the dielectric layer, and
   the plating ring is electrically connected to the conductive trace layer via the plating conductive layer and the conductive stud layer;
   forming a first surface finishing on at least a portion of the exposed conductive trace layer in the cavity; and
   removing the plating conductive layer.

2. The manufacturing method according to claim 1, wherein in the step of forming the conductive trace layer on the second surface of the conductive carrier, the conductive trace layer comprises a plurality of traces mutually isolated from one another.

3. The manufacturing method according to claim 2, wherein in the step of forming the conductive stud layer on the conductive trace layer, the conductive stud layer comprises a plurality of studs correspondingly disposed on the plurality of traces.

4. The manufacturing method according to claim 2, wherein after the step of removing the plating conductive layer, the plurality of traces are electrically isolated from one another.

5. The manufacturing method according to claim 1, wherein the step of forming the dielectric layer comprises:
   providing an encapsulant;
   heating the encapsulant to a molten state;
   infusing the molten encapsulant onto the second surface of the conductive carrier to encapsulate the conductive trace layer and the conductive stud layer in a high-temperature and high-pressure environment; and
   solidifying the molten encapsulant to form the dielectric layer.

6. The manufacturing method according to claim 1, wherein prior to the step of forming the dielectric layer, the manufacturing method further comprises:
   forming an adhesion layer on the conductive trace layer and the conductive stud layer.

7. The manufacturing method according to claim 5, wherein after the step of solidifying the molten encapsulant to form the dielectric layer, the manufacturing method further comprises:
   removing part of the dielectric layer to expose the conductive stud layer from the dielectric layer.

8. The manufacturing method according to claim 5, wherein in the step of solidifying the molten encapsulant to form the dielectric layer, the conductive stud layer is exposed from the dielectric layer.

9. The manufacturing method according to claim 1, wherein the step of forming the plating conductive layer comprises:
   forming a seed layer to envelop the conductive carrier, the dielectric layer and the exposed conductive stud layer; and
   forming a sub-conductive layer over the seed layer.

10. The manufacturing method according to claim 1, wherein the step of forming the first surface finishing comprises:
    forming the first surface finishing on all of the exposed conductive trace layer, simultaneously by electrolytic plating through the plating ring and the plating conductive layer.

11. The manufacturing method according to claim 1, wherein after the step of removing the plating conductive layer, the conductive stud layer is exposed from the dielectric layer.

12. The manufacturing method according to claim 11, wherein after the step of removing the plating conductive layer, the manufacturing method further comprises:
    forming a second surface finishing on the exposed conductive stud layer.

13. The manufacturing method according to claim 1, wherein in the step of removing the plating conductive layer, a portion of the plating conductive layer is removed and a remaining portion of the plating conductive layer at least covers the conductive stud layer.

14. A method of manufacturing a semiconductor device carrier comprises:
    providing a conductive carrier having a first surface and a second surface opposite the first surface;
    forming a plurality of traces on the second surface of the conductive carrier;
    forming a plurality of studs on the plurality of traces;
    forming a dielectric layer to encapsulate the plurality of traces and the plurality of studs,
    wherein the plurality of studs is exposed from the dielectric layer;
    forming a plating conductive layer to envelop the conductive carrier, the dielectric layer and the exposed plurality of studs;
    forming at least one cavity on the conductive carrier to expose the plurality of traces from the dielectric layer in the cavity;
    forming a first surface finishing on at least a portion of the exposed plurality of traces in the cavity; and
    removing the plating conductive layer.

15. The manufacturing method according to claim 14, wherein in the step of forming the plurality of traces on the second surface of the conductive carrier, the plurality of traces are mutually isolated from one another.

16. The manufacturing method according to claim 15, wherein in the step of forming the plurality of studs lay on the plurality of traces, each of the plurality of studs corresponds to at least one trace.

17. The manufacturing method according to claim 15, wherein after the step of removing the plating conductive layer, the plurality of traces are electrically isolated from one another.

18. The manufacturing method according to claim 14, wherein the step of forming the dielectric layer comprises:
    providing an encapsulant;

heating the encapsulant to a molten state;

infusing the molten encapsulant onto the second surface of the conductive carrier to encapsulate the plurality of traces and the plurality of studs in under a high-temperature and high-pressure environment; and solidifying the molten encapsulant to form the dielectric layer.

19. The manufacturing method according to claim 14, wherein prior to the step of forming the dielectric layer, the manufacturing method further comprises:

forming an adhesion layer on the plurality of traces and the plurality of studs.

20. The manufacturing method according to claim 18, wherein after the step of solidifying the molten encapsulant to form the dielectric layer, the manufacturing method further comprises:

Removing a part of the dielectric layer to expose the plurality of studs from the dielectric layer.

21. The manufacturing method according to claim 18, wherein in the step of solidifying the molten encapsulant to form the dielectric layer, the plurality of studs is exposed from the dielectric layer.

22. The manufacturing method according to claim 14, wherein the step of forming the plating conductive layer comprises:

forming a seed layer to envelop the conductive carrier, the dielectric layer and the exposed plurality of studs; and forming a sub-conductive layer over the seed layer.

23. The manufacturing method according to claim 14, wherein the step of forming at least one cavity on the conductive carrier comprises:

removing at least a portion of the conductive carrier, wherein a remaining portion of the conductive carrier forms a plating ring around the peripheral of the dielectric layer.

24. The manufacturing method according to claim 23, wherein in the step of forming the plating ring, the plating ring is electrically connected to the plurality of traces via the plating conductive layer and the plurality of studs.

25. The manufacturing method according to claim 24, wherein the step of forming the first surface finishing comprises:

forming the first surface finishing on each of the exposed plurality of traces simultaneously, by electrolytic plating through the plating ring and the plating conductive layer.

26. The manufacturing method according to claim 14, wherein after the step of removing the plating conductive layer, the plurality of studs are exposed from the dielectric layer.

27. The manufacturing method according to claim 26, wherein after the step of removing the plating conductive layer, the manufacturing method further comprises:

forming a second surface finishing on the exposed plurality of studs.

28. The manufacturing method according to claim 14, wherein in the step of removing the plating conductive layer, a portion of the plating conductive layer is removed and a remaining portion of the plating conductive layer at least covers the plurality of studs.

\* \* \* \* \*